April 12, 1955 J. VACKÁŘ 2,706,249

STABILIZATION OF RESONANT CIRCUITS

Filed Feb. 10, 1950 2 Sheets-Sheet 1

INVENTOR

Jiří Vackář

BY

Paul Smith

ATTORNEY

April 12, 1955 J. VACKÁŘ 2,706,249

STABILIZATION OF RESONANT CIRCUITS

Filed Feb. 10, 1950 2 Sheets-Sheet 2

INVENTOR
Jiří Vackář
BY
ATTORNEY

United States Patent Office 2,706,249

Patented Apr. 12, 1955

2,706,249

STABILIZATION OF RESONANT CIRCUITS

Jiří Vackář, Prague, Czechoslovakia, assignor of one-half to Tesla, National Corporation, Prague, Czechoslovakia, a corporation of Czechoslovakia Application February 10, 1950, Serial No. 143,419

Claims priority, application Czechoslovakia February 26, 1949

2 Claims. (Cl. 250—36)

The present invention relates to the stabilization of resonant circuits, more particularly to a circuit for stabilizing the frequency and the amplitude of the complete tuning range of valve oscillators.

Various arrangements have been proposed for stabilizing the frequency and amplitude of oscillators. However, none of the known arrangements are effective to maintain such stability over the complete frequency range of the oscillator. In one well known arrangement, there is a decrease in amplitude toward the lower end of the frequency range, and an increase toward the higher and resulting from excessive excitation of the oscillator valve. In another known arrangement, opposite effects take place.

When the resonant frequency is varied, by adjustment of the circuit constants, the quality factor usually remains constant over the frequency range. While damping may be used to vary the quality factor to obtain a constant amplitude over the frequency range, such damping is undesirable as it adversely affects the frequency stability of the oscillator.

The present invention is directed to an oscillator resonant circuit including a combination of impedances arranged in such manner as to mutually compensate for variations in amplitude with frequency changes. This mutually compensating effect thereby provides substantially stable amplitude over a wide range of frequencies.

For an understanding of the invention principles, reference is made to the following description of prior art arrangements and embodiments of the invention, as illustrated in the accompanying drawings. In the drawings.

Figure 1:
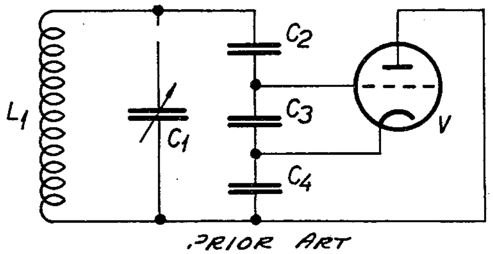
Figs. 1 and 2 are schematic illustrations of typical prior art oscillator resonance circuits.

Fig. 1 shows a parallel resonant circuit $L_1$, $C_1$. A voltage divider comprising three capacitors $C_2$, $C_3$ and $C_4$ is in parallel with the main tuning capacitor $C_1$. The grid, cathode and anode of the oscillating valve V are connected to three corresponding points of the capacitive voltage divider.

Figure 2:
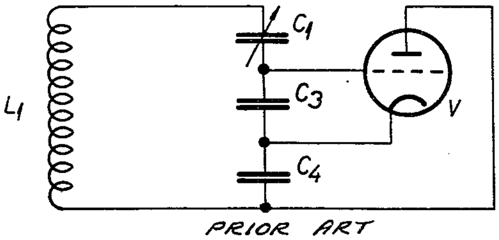
PRIOR ART Fig. 2.

Fig. 2 shows another known circuit in which a capacitive voltage divider $C_3$, $C_4$ is connected in series with the tuning capacitor $C_1$ of the resonant circuit $L_1$, $C_1$. The oscillating valve V is connected to the voltage divider in a manner similar to that of Fig. 1.

Neither of these two circuits provides a constant amplitude for a wide frequency range. In the circuit according to Fig. 1 there is an amplitude drop towards the long wave or lower frequency end of the range, and an increase toward the higher frequency end where the excitation of the valve is excessive and detrimental to stability. In the circuit according to Fig. 2, conditions are just reversed. Variations dependent on the tuning of the resonant circuit occur usually with a constant quality factor over the complete tuning range. Although it is possible, by means of proper damping, to obtain a variable quality factor and a constant amplitude, this is not convenient because it would reduce the frequency stability.

With the above said in mind, it is an object of the present invention to obtain a stable resonant circuit.

Figure 3:
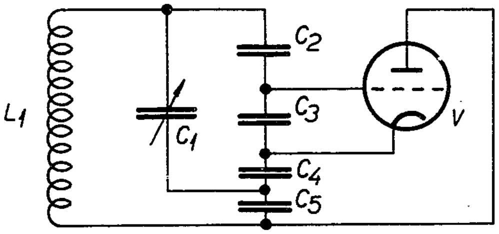
PRIOR ART Fig. 3.
Figs. 3, 4 and 5 are schematic illustrations of oscillator resonance circuits embodying the invention principles.
Figure 4:
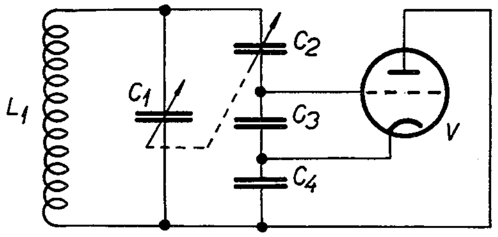
Figure 5:
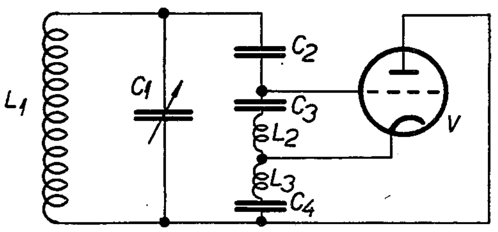

This and other objects and features of the invention follow from the following specification and the accompanying drawings of which Figs. 3 to 5 show various embodiments of the same basic principle of the invention.

In the embodiment of the invention shown in Fig. 3, a capacitive voltage divider $C_2$, $C_3$, $C_4$ and $C_5$ is added to the resonant circuit $L_1$, $C_1$. The capacitors $C_2$, $C_3$ and $C_4$ are in parallel with the tuning capacitor $C_1$, whereas the capacitor $C_5$ is in series with the tuning capacitor $C_1$. Capacitors $C_4$ and $C_5$ are of much higher values than the capacities $C_2$ and $C_3$ of the voltage divider (for example 100 times higher than $C_2$ and 10 times higher than $C_3$).

With this circuit it is possible to utilize the maximum value of the quality factor of the employed inductance $L_1$, over the complete tuning range and the circuit has a substantially constant amplitude characteristic.

The circuit operates in the following manner:

If the resonant frequency of the circuit is increased by reducing the value of the tuning capacity $C_1$, the reactive impedance of the inductance $L_1$ is increased, and if the quality factor Q remains constant, the parallel resistance of the circuit, given by the expression $R=\omega LQ$ and representing also the load resistance of the oscillating valve V, is also increased.

If, however, a constant amplitude is required for a wide frequency band, it is necessary that the load resistance be constant.

In order that the amplitude of the oscillations constant independent of the tuning (variations of $C_1$), the load resistance of the oscillating tube which is effective in the anode-cathode circuit should also remain constant and independent of $C_1$. In Figure 3 this load resistance is formed by a resonant circuit. The value of this resistance which is effective between the anode and cathode of the tube, can be found by the following analysis based on four (4) assumptions:

1. The quality factor Q of the inductance L of the tuned circuit is constant and independent of frequency, so that the losses in the inductance can be expressed by a resistance R connected in parallel with the inductance, and which may be expressed as $$R_p=\omega L\cdot Q \qquad (1)$$

2. The driving power supplied to the grid of the tube from the tuned circuit may be neglected, so that all the power supplied to the tuned circuit by the tube is consumed in the resistance $R_p$, the capacities having no losses.

3. The wattless H. F. current circulating in the capacities $C_4$ and $C_5$ is many times larger than the alternating component of the anode current $I_a$. This assumption is fulfilled if the capacities are sufficiently large, which must be taken into consideration when designing the circuit.

4.

$$C_1 \gg C_2 \qquad (2)$$

$$C_2 \ll C_3 \qquad (3)$$

$$C_2 \ll C_4 \qquad (4)$$

$$C_1 \ll C_5 \qquad (5)$$

the sign » indicating "much larger" and « indicating "much smaller."

If assumptions 3 and 4 are fulfilled, the H. F. voltage across the circuit will be divided in proportion to the reactances of the capacities, and therefore the following relations will exist:

$$\frac{C_5}{C_1+\cfrac{1}{\cfrac{1}{C_2}+\cfrac{1}{C_3}+\cfrac{1}{C_4}}} \qquad (6)$$

In view of the relations mentioned before under (2), (3), (4), the equation (6) may be approximated as follows:

$$\frac{U_1}{U_5} \doteq \frac{C_5}{C_1} \qquad (7)$$

$$\frac{U_2}{U_3} \doteq \frac{C_3}{C_2} \qquad (8)$$

$$\frac{U_2}{U_4} \doteq \frac{C_4}{C_2} \qquad (9)$$

and so on, $U_1$, $U_2$, $U_3$, $U_4$ being the negative partial voltages across capacitors $C_1$, $C_2$, $C_3$, $C_4$, $C_5$.

If $U_0$ designates the total voltage across the circuit, the following approximate relation is fulfilled (referring to assumption 4):

$$U_0 \doteq U_1 \doteq U_2 \quad (10)$$

Assumption 2 may now be expressed by the following equation:

$$\frac{U_0^2}{R_p} = (U_4 + U_5) . I_a \quad (11)$$

which indicates that the power consumed in the circuit is equal to the power supplied by the tube.

The load resistance of the tube which is effective between the anode and cathode thereof, can now be expressed as $$R_a = \frac{U_4 + U_5}{I_a} \quad (12)$$

and by substituting expression (11) for $I_a$ $$R = \frac{(U_4 + U_5)^2}{U^2} \cdot R_p \quad (13)$$

From (9) and (10), $$U_4 \doteq U_0 \cdot \frac{C_2}{C_4} \quad (14)$$

Similarly from (7) and (10)

$$U_5 \doteq U_0 \cdot \frac{C_1}{C_5} \quad (15)$$

so that (13) may be rewritten as $$R_a = R_p \cdot \left(\frac{C_2}{C_4} + \frac{C_1}{C_5}\right)^2 \quad (16)$$

The value of capacity $C_1$ is, however, a function of frequency, $C_1$ being the tuning capacity. If $C_0$ designates its maximum value, corresponding to the lowest frequency $\omega_{min}$ of the tuning range, and if the effect of $C_2$ is neglected (because $C_2 \ll C_1$), $$C_1 = C_0 \left(\frac{\omega_{min}}{\omega}\right)^2 \quad (17)$$

This substituted into (16) yields $$R_a = R_p \left(\frac{C_2}{C_4} + \frac{C_0}{C_5} \cdot \frac{\omega_{min}^2}{\omega^2}\right)^2 = R_p \left[\left(\frac{C_2}{C_4}\right)^2 + 2 \cdot \frac{C_2 C_0}{C_4 C_5} \cdot \frac{\omega_{min}^2}{\omega^2} + \left(\frac{C_0}{C_5}\right)^2 \cdot \frac{\omega_{min}^4}{\omega^4}\right] \quad (18)$$

Expression (18) shows that the load resistance $R_a$ of the oscillator is determined by the sum of 3 components of which the first is produced across $C_4$ through transforming $R_p$ by the constant $$\left(\frac{C_2}{C_4}\right)^2$$

whereas the third component is produced across $C_5$ through transforming $R_p$ by $$\left(\frac{C_1}{C_5}\right)^2$$

or $$\left(\frac{C_0}{C_5} \cdot \frac{\omega_{min}^2}{\omega^2}\right)^2$$

That is to say it is indirectly proportional to the 4th power of the frequency. The value of the second member which is produced through interaction between $C_4$ and $C_5$, is the geometrical mean between the first and second component, so that only the first and second component must be taken into consideration if it is desired to keep the value of expression (18) constant.

The sum of these two components, one of which is directly proportional to the frequency whereas the second is indirectly proportional to the third power of the frequency, can be kept constant, for practical purposes, over a wide frequency range (for example $F_{min}:F_{max} = 1:3$)

if the two components equal each other in the vicinity of the long wave end of the range, at a frequency of approximately $F = 1.25\ F_{min}$.

The circuit of Fig. 3 can be applied as a control circuit in transmitters, and also in oscillatory circuits in superhet receivers. In the second case a further advantage is obtained if the capacitors $C_4$ and $C_5$, which may be varied within narrow limits without injury to stability are also used for obtaining accurate ganging relation between the tuned receiving and oscillating circuits.

Figs. 4 and 5 show two further examples of embodiment of the fundamental idea of the invention. In each case a capacitive, frequency-dependent voltage divider is used for obtaining a constant amplitude.

Fig. 4 shows a circuit which combines the features of the circuits shown in Figs. 1 and 2. The tuning capacitor $C_1$, for example, is in direct gang with the capacitor $C_2$ (or in reversed gang with the capacity $C_4$). Their effect upon the amplitude is therefore balanced.

In the arrangement shown in Fig. 5, the resonant circuit of Fig. 1 is modified by the use of inductances of suitable value, which are connected in series with the capacitive voltage divider. Therein the apparent capacity changes in dependence on frequency. These inductances can be connected, for example, in series with only one of the capacities of the divider. The impedances of the said inductances are chosen such that, at the highest frequency of the tuning range, it approximates only ½ or ¾ of the reactance of the corresponding capacity.

What we claim is:

1. In an oscillator, in combination, a resonant circuit comprising a tuning inductor and a tuning capacitor, a capacitive voltage divider comprising, in series, a first, second, third and fourth capacitor, all said capacitors being non-variable, said first, second and third capacitor in parallel across said tuning capacitor, said fourth capacitor in series with said tuning capacitor, an oscillating tube, the grid of said tube connected between said first and second capacitor, the cathode connected between said second and third capacitor, the anode of said valve connected between said fourth capacitor and the tuning inductance, said third and fourth capacitor being of a higher order of capacitance than said first and second capacitor.

2. An oscillator as claimed in claim 1 in which the capacitance of said third and fourth capacitor is substantially 100 times greater than that of said first capacitor and substantially 10 times greater than that of said second capacitor.

References Cited in the file of this patent

UNITED STATES PATENTS

| | | |
|---|---|---|
| 1,962,104 | Harnett | June 5, 1934 |
| 2,018,370 | Lunnon | Oct. 22, 1935 |
| 2,137,265 | Buschbeck | Nov. 22, 1938 |
| 2,400,895 | Wachtman | May 28, 1946 |
| 2,400,896 | Wachtman | May 28, 1946 |
| 2,400,897 | Wachtman | May 28, 1946 |
| 2,505,577 | Rich | Apr. 25, 1950 |
| 2,591,792 | Donley | Apr. 8, 1952 |